(12) United States Patent
Moench et al.

(10) Patent No.: US 9,789,631 B2
(45) Date of Patent: Oct. 17, 2017

(54) SYSTEM FOR AND METHOD OF HEATING OBJECTS IN A PRODUCTION LINE

(75) Inventors: Holger Moench, Vaals (NL); Johannes Baier, Wuerselen (DE); Jaione Bengoechea Apezteguia, Aachen (DE); Ulrich Weichmann, Aachen (DE); Serge Monteix, Nanct (FR)

(73) Assignee: Koninklijke Philips N.V., Eindhoven (NL)

( * ) Notice: Subject to any disclaimer, the term of this patent is extended or adjusted under 35 U.S.C. 154(b) by 2106 days.

(21) Appl. No.: 12/518,903

(22) PCT Filed: Dec. 17, 2007

(86) PCT No.: PCT/IB2007/055171
§ 371 (c)(1),
(2), (4) Date: Apr. 19, 2010

(87) PCT Pub. No.: WO2008/075280
PCT Pub. Date: Jun. 26, 2008

(65) Prior Publication Data
US 2010/0230863 A1 Sep. 16, 2010

(30) Foreign Application Priority Data
Dec. 19, 2006 (EP) .................................. 06126550

(51) Int. Cl.
*B29B 13/02* (2006.01)
*B29C 49/06* (2006.01)
(Continued)

(52) U.S. Cl.
CPC ............ *B29B 13/024* (2013.01); *B29C 49/06* (2013.01); *B29C 49/68* (2013.01);
(Continued)

(58) Field of Classification Search
CPC ....................... B23K 26/0838; B23K 26/0846
(Continued)

(56) References Cited

U.S. PATENT DOCUMENTS 3,279,355 A * 10/1966 Missioux ......................... 100/26
4,534,811 A * 8/1985 Ainslie et al. ............... 156/73.1
(Continued)

FOREIGN PATENT DOCUMENTS

DE          10106607 A1    9/2002
JP          63262414 A    10/1988
(Continued)

*Primary Examiner* — Steven B McAllister
*Assistant Examiner* — Ko-Wei Lin (57) ABSTRACT

A system and method (10) for heating objects (O) during a thermal treatment process in a production line (P) is described. The system (10) comprises a transport system (11), a minor arrangement (201, 202, 203, 204, 205, 206) comprising a first mirror surface (21, 21', 21") and a second minor surface (22, 22', 22") arranged at opposite sides, so that the objects (O) may be transported between the minor surfaces (21, 22, 21', 22', 21", 22") along the production line and a radiation device (30) comprising a number of lasers for generating light (L). The radiation device (30) and the mirror arrangement (201, 202, 203, 204, 205, 206) are constructed such that the main direction (R) of light (L) that enters the mirror arrangement (201, 202, 203, 204, 205, 206) is directed towards the first mirror surface (21, 21', 21") at an angle to the production line (P), and the light (L) subsequently undergoes multiple reflections between the mirror surfaces (21, 22, 21', 22', 21", 22") so that a series of multiple reflections of the light (L) travels in the transport direction (OT) along at least a section of the minor surface (21, 22, 21', 22', 21", 22") or travels against the transport direction (OT) along at least a section of the minor surface (21, 22, 21', 22', 21", 22") and heats the objects (O) being (Continued)

transported between the minor surfaces (21, 22, 21', 22', 21", 22").

16 Claims, 8 Drawing Sheets

(51) Int. Cl.
    *B29C 49/68*     (2006.01)
    *B29C 35/08*     (2006.01)
    *B29K 67/00*     (2006.01)
    *B29K 105/00*     (2006.01)
    *H01S 5/183*     (2006.01)
    *H01S 5/42*     (2006.01)

(52) U.S. Cl.
    CPC ............... *B29C 2035/0822* (2013.01); *B29C 2035/0838* (2013.01); *B29K 2067/00* (2013.01); *B29K 2105/258* (2013.01); *H01S 5/18388* (2013.01); *H01S 5/426* (2013.01)

(58) Field of Classification Search
    USPC ............ 219/121.6, 121.74, 121.82; 264/400
    See application file for complete search history.

(56) References Cited

U.S. PATENT DOCUMENTS

| | | | | |
|---|---|---|---|---|
| 5,208,434 | A | * | 5/1993 | Minamida et al. ......... 219/121.6 |
| 5,538,056 | A | * | 7/1996 | Thoma .......................... 144/342 |
| 5,575,936 | A | * | 11/1996 | Goldfarb .................. 219/121.68 |
| 5,780,524 | A | * | 7/1998 | Olsen ................................. 522/2 |
| 6,429,403 | B1 | * | 8/2002 | Nakayama ............... 219/121.82 |
| 6,526,985 | B1 | * | 3/2003 | Dombek ....................... 131/281 |
| 6,639,176 | B1 | * | 10/2003 | Urech ...................... 219/121.63 |
| 6,980,572 | B2 | | 12/2005 | Geske |
| 7,723,730 | B2 | * | 5/2010 | Groetsch et al. ................ 257/79 |
| 2002/0108935 | A1 | * | 8/2002 | Schad et al. ............. 219/121.67 |
| 2002/0115037 | A1 | | 8/2002 | Cao |
| 2004/0124563 | A1 | * | 7/2004 | Fleming et al. .............. 264/482 |
| 2004/0188396 | A1 | * | 9/2004 | Talwar et al. ............. 219/121.65 |
| 2008/0099961 | A1 | * | 5/2008 | Feuilloley et al. ........... 264/405 |

FOREIGN PATENT DOCUMENTS

| | | |
|---|---|---|
| JP | 2002026466 A | 1/2002 |
| WO | 2004009318 A1 | 1/2004 |
| WO | 2004098003 A1 | 11/2004 |
| WO | 2006056673 A1 | 6/2006 |

* cited by examiner

SYSTEM FOR AND METHOD OF HEATING OBJECTS IN A PRODUCTION LINE

This invention relates in general to systems for heating objects and to methods of heating objects during a thermal treatment process, in particular a thermal deformation process, in a production line.

For industrial heating applications such as thermal deformation processes like bottle blowing, drying, hardening, rapid thermal processing, etc., light sources like incandescent or Xenon lamps have typically been in use until now. Meanwhile, IR laser diodes are a most efficient radiation source. The well-defined and narrow wavelength band in addition to the high collimation of the radiation make them the next generation light source for industrial heating applications, where incandescent or Xenon lamps have reached their limits. An overview of laser heating methods and practical arrangements for bottle blowing are given in WO 2006/056673 A1. This document mentions the advantage of high power density of lasers as well as the wavelength region 800-1064 nm, which is good for PET heating, because the absorption is rather low. The advantage is that the radiation is then absorbed in the whole volume rather than just the skin. One the other hand, this requires many passes of laser light through the PET form. Therefore, in this document some reflector arrangements suitable for the multiple pass of a laser light ray are given, whereby the reflector arrangement comprises two opposing semicircular reflector surfaces. A laser beam directed into this reflector arrangement undergoes multiple radial reflections between the reflector surfaces in a star-shaped manner around a common focal point of the semicircular reflector surfaces. To make full use of the light reflected between the surfaces, the PET form has to be located in the centre of the reflector arrangements. This requires a stepwise processing of the PET forms, and does not allow an uninterrupted product flow. A further disadvantage is that the laser sources required in these embodiments for the heating process are high power laser diode bars. The emitted infrared power of a single 1 cm long laser bar mentioned in this document is 100 W. High power diode laser bars are, however, very expensive. Furthermore, the extreme energy concentration requires sophisticated mounting and cooling techniques, resulting in additional costs that may be ten times more than the cost of the original laser diode.

Therefore, an object of the present invention is to provide more economical systems for heating objects and methods of heating objects during a thermal treatment process, in particular during a thermal deformation process in a production line, while allowing an uninterrupted continuous product flow.

To this end, the present invention provides a system for heating objects during a thermal treatment process in a production line, comprising:
  a transport system for transporting the objects in a transport direction along the production line,
  a mirror arrangement comprising a first mirror surface and a second mirror surface arranged at opposite sides along at least a section of the production line, so that the objects may be transported between the mirror surfaces along the production line,
  and a radiation device comprising a number of lasers for generating light,
  whereby the radiation device and the mirror arrangement are constructed such that the main direction of light that enters the mirror arrangement is directed towards the first mirror surface at an angle to the production line, and the light subsequently undergoes multiple reflections between the mirror surfaces so that a series of multiple reflections of the light travels in the transport direction, i.e. with the objects, along at least a section of the mirror surface, or travels against the transport direction along at least a section of the mirror surface, and heats the objects being transported between the mirrors.

Thereby, the 'main direction' of light is to be understood as the direction in which the majority of the light is radiated. In the case of a diverging beam of light, the main direction is, for example, the direction of the central axis of the beam of light.

Furthermore, the term 'series of multiple reflections of the light'—in the context of the light travelling along at least a section of the mirror surface in or against the transport direction—is to be understood such that more than two or three consecutive reflections of a beam of light continue in the same direction along the section of the mirror surface, and are not reflected back and forth about a central focus, as in the embodiments proposed by WO 2006/056673 A1. A 'mirror surface' in the context of the invention is any surface that essentially completely reflects the light falling on that surface. Therefore, in the following, the terms 'reflector' and 'mirror' are used interchangeably and have the same meaning.

The invention provides a corresponding method for heating objects during a thermal treatment process in a production line,
  wherein the objects are transported in a transport direction along the production line between a first mirror surface and a second mirror surface of a mirror arrangement, which first mirror surface and second mirror surface are arranged at opposite sides along at least a section of the production line,
  wherein light is generated by a number of lasers of a radiation device,
  wherein the generated light is directed into the mirror arrangement such that the main direction of light that enters the mirror arrangement is directed towards the first mirror surface at an angle to the production line, and the mirror arrangement is constructed such that the light subsequently undergoes multiple reflections between the mirror surfaces, so that a series of multiple reflections of the light travels in the transport direction along at least a section of the mirror surface, or travels against the transport direction along at least a section of the mirror surface, and heats the objects being transported between the mirrors.

An advantage of this construction is that it allows the light that enters the mirror arrangement to be used to the full in a continuous product flow. Because of this intelligent exploitation of the incoming light, a reduction in the light output of the radiation source is possible—by using less high power laser diode bars, or, as will be explained later, by advantageously using more economical lower-power laser diodes.

The dependent claims and the subsequent description disclose particularly advantageous embodiments and features of the invention.

Preferably, the system according to the invention is used for heating objects which are at least partially transparent for the generated light so that the light is partially absorbed by plurality of the objects between the mirror surfaces while the objects are transported through the mirror arrangement. In such applications, the mirror arrangement according to the invention is particularly advantageous, since during each passage of the light through an object to be heated, the light is only partially 'used'—i.e. absorbed—and, since the weakened beam of light is then immediately reflected onto another object, the remaining energy of the light can be used again. The system according to the invention can, of course, also be used for thermal processing of other types of product, particularly when these are products that are transported through the process chain separated by relatively large distances, so that a beam of light perhaps only impinges on an object after first undergoing multiple reflections in the mirror arrangement. The system is particularly preferably used for thermal deformation processes such as the PET bottle blowing mentioned in the introduction.

Depending on the actual application, different intensity profiles might be required along the transport direction of the objects. For instance, in one application, evenly distributed radiation by the light may be necessary, whereas in another application, an initial slight warming may be required, followed by a steady increase in light intensity until, ultimately, a particularly hot spot is reached. Equally, it might be necessary to follow a hot spot by a more gradual cooling than in another application. Therefore, in a preferred embodiment, the mirror arrangement is constructed such that, the multiple reflections of the light result in a predefined intensity profile of the light desired for the specific application, in a direction of travel of the light downstream from a point of entry of the light into the mirror arrangement. Thereby, the intensity profile may be defined for an empty mirror arrangement, i.e. in an arrangement in which no objects are being transported. The 'direction of travel' is to be understood as the 'net direction' of travel of the light, along which the light travels in a zigzag manner between the mirror surfaces. In the following, this direction will also be referred to as the 'overall direction of travel of the light'. The term 'downstream from a point of entry' is defined with regard to the initial overall direction of travel of the light. That means that, when the light initially travels in the transport direction, the desired intensity profile develops from the point of entry of the light in the transport direction, while, in the case where the light initially travels against the transport direction, the intensity profile is correspondingly formed upstream from the point of entry of light with reference to the transport direction.

In a particularly preferred variation of such an embodiment, the mirror arrangement is constructed such that, if the mirror arrangement were empty, the multiple reflections of the light would result in an increase in the intensity of the light in a direction of travel of the light downstream from the point of entry of the light. The system can be configured so that the increase in intensity would compensate for the loss in intensity due to absorption of the light by the objects. Equally, in another preferred embodiment, it is possible that the intensity of the light increases with increasing distance from the point of entry of the light, so that, for example, an object is heated gradually until it reaches the hottest location in the mirror arrangement. On the other hand, the hottest location in the mirror arrangement could be close to, or in the vicinity of, the point of entry of the light.

For example, to achieve an increase in the intensity of the light in a direction of travel of the light downstream from the point of entry preferably the mirror arrangement is constructed such that the distances between points of incidence of a ray of light on a single mirror surface of the mirror arrangement decrease in a direction of travel of the light downstream from the point of entry of the light into the mirror arrangement. This is because, with increasing distance from the point of entry along the direction of travel of the light, a beam of light is reflected between the mirror surfaces with steadily decreasing distance between the reflections. Thus, the zigzag path travelled by the ray of light becomes more and more compressed, i.e. the sections of this path of travel are closer together along the central axis between the mirror surfaces, i.e. along the direction of transport of the objects, ultimately leading to an increase in intensity of the light.

One way of thus controlling the intensity profile is to construct the mirror arrangement such that the first mirror surface and the second mirror surface approach one another over at least a section of the mirror arrangement along a direction of travel of the light downstream from a point of entry of the light into the mirror arrangement. In other words, the mirror surfaces of the mirror arrangement are arranged, for example, in the manner of a funnel.

In a first preferred embodiment, the first mirror surface and the second mirror surface are planar, i.e. level along the direction of transport and are positioned at an angle to one another. This simple construction permits, in a straightforward manner, the distance between the point of incidence of a ray of light on an individual mirror surface of the mirror arrangement to decrease in the direction of travel of the light downstream from the point of entry. This will be described later in detail with the aid of the diagrams.

In a further preferred embodiment, at least one of the mirror surfaces is curved so that at least the section of the mirror surface downstream from the point of entry of the light is curved inwards toward the objects travelling along the production line. In a particularly preferred variation thereof, at least one of the mirror surfaces is concave. In a further preferred variation, at least one convex mirror surface is used.

The mirror arrangement maybe constructed such that the light entering the mirror arrangement initially travels in a first overall direction downstream from a point of entry of the light and that the direction of travel of the light is reversed after a certain distance in the mirror arrangement downstream from the point of entry of the light. In this construction, the light that has already been multiply reflected and partially absorbed by objects in its path so that it has lost intensity, is reversed to travel back in the direction of the point of entry of the light so that the remaining energy of the light is optimally exploited.

This can be achieved in a number of ways. For instance, the first and second mirror surfaces can be shaped and arranged with respect to each other in an appropriate manner. It will later be shown that this effect is achieved when two planar mirror surfaces are arranged at an angle to each other in the manner of a funnel.

In an alternative embodiment, the mirror arrangement comprises a mirror surface region which is arranged to essentially reflect the light back in the opposite direction. In this case, the light takes essentially the same path back along the production line, i.e. the path it travelled to arrive at the specific mirror surface region. The specific mirror surface region used for this purpose may be a separate mirror, or may be a section of one of the mirror surfaces which is bent, or otherwise shaped, in an appropriate manner.

In a further embodiment the mirror surfaces diverge, i.e. they move outwards from each other, in a direction downstream from the point of entry of the light, in order to achieve an intensity profile which decreases in a direction of travel of the light downstream from the point of entry.

To couple the light into the mirror arrangement, the light of at least the group of lasers of the radiation device is preferably focused to direct the light into the mirror arrangement in such a way that the light rays are focused in or near a light entry opening of the mirror arrangement. That means that in the method according to the invention, unlike in the prior art, the light of the individual lasers is not focussed in the object that it heats, but is focussed at the point of entry in the mirror arrangement. The light is then exploited by advantageously reflecting it, using the means described above, so that most of the light intensity is converted to thermal energy in the objects themselves.

In many cases, it makes sense to use mirror surfaces that are not curved laterally with respect to the transport direction, so that the light entering the mirror arrangement does not undergo a focussing or defocusing in a direction other than the transport direction.

This is particularly expedient in the case of elongated objects, such as PET bottles that are to be blown, since these must be irradiated over their entire length.

Accordingly, the light entry opening of the mirror arrangement may have the form of a longitudinal opening such as a slit, and the beam of light can be focussed along the entire slit over the length or width of the object. Naturally, it is also possible to obtain a point focus and to realise the light entry opening as a round aperture. Basically, the light entry opening can be realised in any shape. However, it is expedient to have a relatively narrow opening to prevent stray light from once more exiting through the light entry opening.

In another possible embodiment, the first mirror surface and/or the second mirror surface are curved laterally with respect to the direction of transport of the objects. So, if the production line is visualised to lie in a horizontal plane, the mirror surfaces can be visualised to curve inwards above and/or below this plane. The amount of curvature can be very small, but sufficient to compensate for a slight divergence of the ray of light over its path between the mirror surfaces. Also, the mirror surfaces may comprise two ore more different height zones corresponding to different heating loci (positions) that can be achieved by a suitable laser set-up. These height zones can have a slight focussing effect so that the beams of light of different height zones do not significantly coalesce.

Furthermore, a mirror surface can be constructed so that the curvature of the mirror surface is different for different segments or sections of the mirror.

To heat the products over a longer section along the production line, the mirror arrangement preferably comprises a plurality of stages along the production line, whereby each stage comprises a first mirror surface and an opposing second mirror surface along a subsection of the production line. The light can be directed into each of these stages. Evidently, it is also possible to direct several beams of light, or several bundles of light beams, from groups of lasers, through different entry openings into a stage of the mirror arrangement, in order to obtain a higher light intensity.

As already explained above, it has been surprisingly found that there is no real need to use high power laser diode bars when the reflections of the light are used efficiently. Therefore, in the system according to the invention, a Vertical Cavity Surface Emitting Laser (VCSEL) can be used as a source of laser light. These lasers can be manufactured much more economically, and have the advantage that their power dissipation is lower since each individually generates less light output, so that the required cooling is also more economical to realise than for the high power laser bars. Indeed, VCSEL are proposed for use in applications as an alternative to conventional LEDs. For example, in WO 2004/009318 A1 an addressable LED array is described for use as a radiation source in a photocuring process, and it is mentioned that VCSELs may be used instead of LEDs. However, photocuring is a radiation treatment process in which not so high radiation energies are necessary on or near the objects to be treated, but, by the intelligent bundling of the light and its exploitation in the mirror arrangement, according to the invention, VCSELs may also be used for thermal treatment processes such as thermal deformation, in which high energies of more than . . . must be provided.

Preferably, Vertical Extended Cavity Surface Emitting Lasers (VECSEL) are used, which are Vertical Cavity Surface Emitting Lasers for which the cavity is extended by means of an additional out-coupling reflector at a distance from the actual semiconductor substrate. In this realisation, beams of laser light can be generated, having an improved collimation of less than 1° per half-cone angle, so that the power density is considerably greater than in the case of the usual VCSELs.

Such VECSELs have been used up until now in telecommunications applications to inject light signals exactly into optic fibres. Unexpectedly, it was discovered that such laser light sources arranged in a certain manner in laser arrays were particularly suitable for heating objects in thermal treatment processes in which high energies of more than 1 $W/mm^2$, and preferably more than 2 $W/mm^2$, are needed, as for example thermal hardening, drying, rapid thermal processing, and particular in thermal deformation processes. Therefore, a further method for providing a solution to the problem described above comprises generating infrared light using a plurality of VECSELs in a number of stages, i.e. one or more stages, along a production line, and to direct this in a predefined manner at the objects to be heated.

An appropriate system for heating an object during a thermal treatment process, in particular a thermal deformation process, in a production line according to this method comprises a radiation device comprising a plurality of Vertical Extended Cavity Surface Emitting Lasers for generating infrared light which radiation device is constructed and arranged with respect to the production line so that the infrared light heats the objects being transported along the production line. A radiation device can thereby preferably comprise a plurality of VECSEL arrays.

In particular, such an arrangement of the radiation device with a plurality of VECSELs or VECSEL arrays is expedient when the radiation device is constructed such that the light of at least a group of the lasers of the radiation device is focused to direct the light into a mirror arrangement through which the objects to be heated are transported such that the light rays are focused in or near a light entry aperture of the mirror arrangement. This can be achieved, for example, by an expedient arrangement of the individual VECSEL or VECSEL arrays and/or with the aid of suitable optical systems of the radiation device, such as mirrors, lenses, optical carriers, etc.

Other objects and features of the present invention will become apparent from the following detailed descriptions considered in conjunction with the accompanying drawings. It is to be understood, however, that the drawings are designed solely for the purposes of illustration and not as a definition of the limits of the invention. In the drawings, wherein like reference characters denote the same elements throughout:

The dimensions of the objects in the figures have been chosen for the sake of clarity and do not necessarily reflect the actual relative dimensions.

In the following, the invention is described using examples in which the objects O to be heated are PET pre-forms O for blowing PET bottles, since this is a preferred application of the invention, without the invention being restricted to this application.

Figure 1:
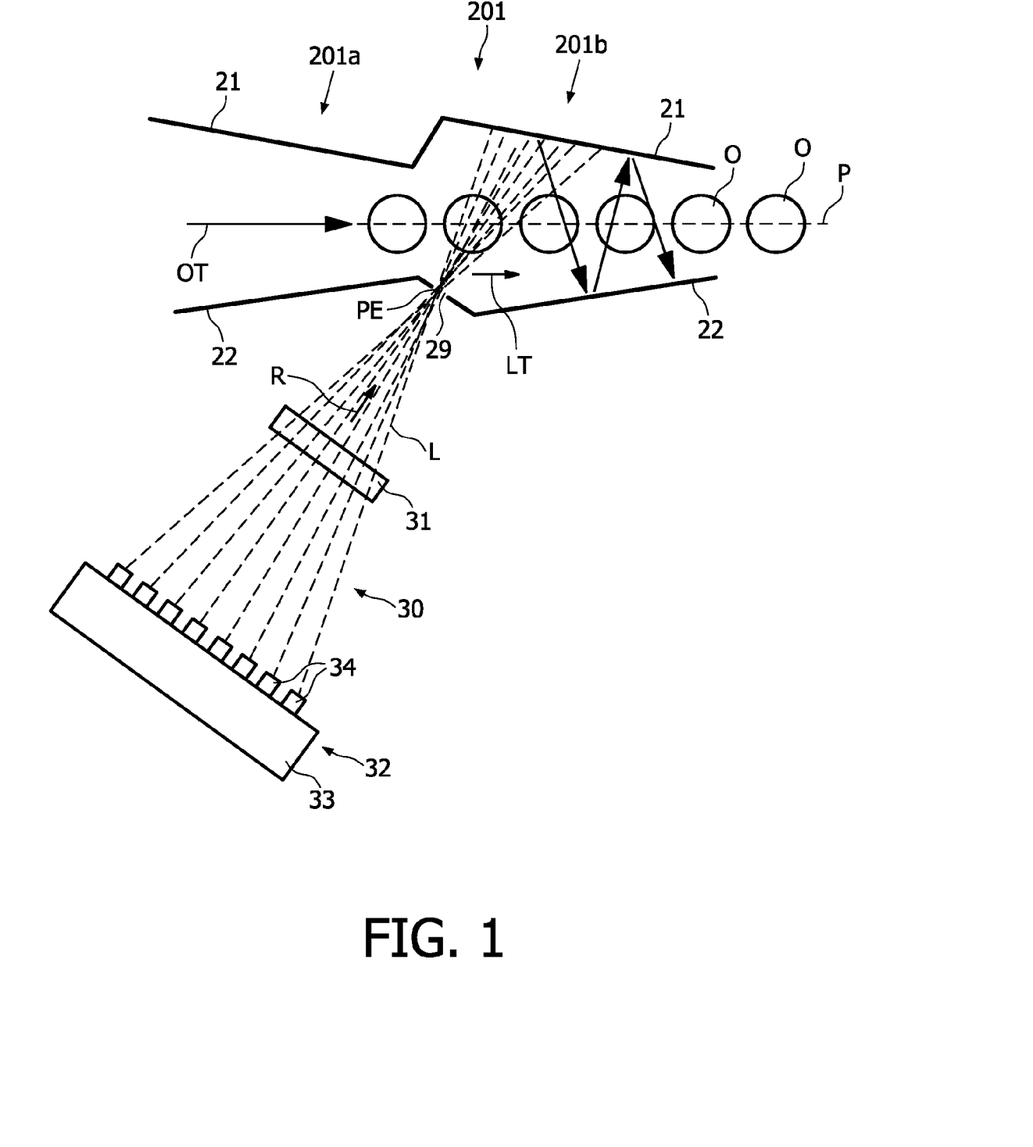
FIG. 1 shows a schematic top view of a system in accordance with a first embodiment of the present invention.
Figure 2:
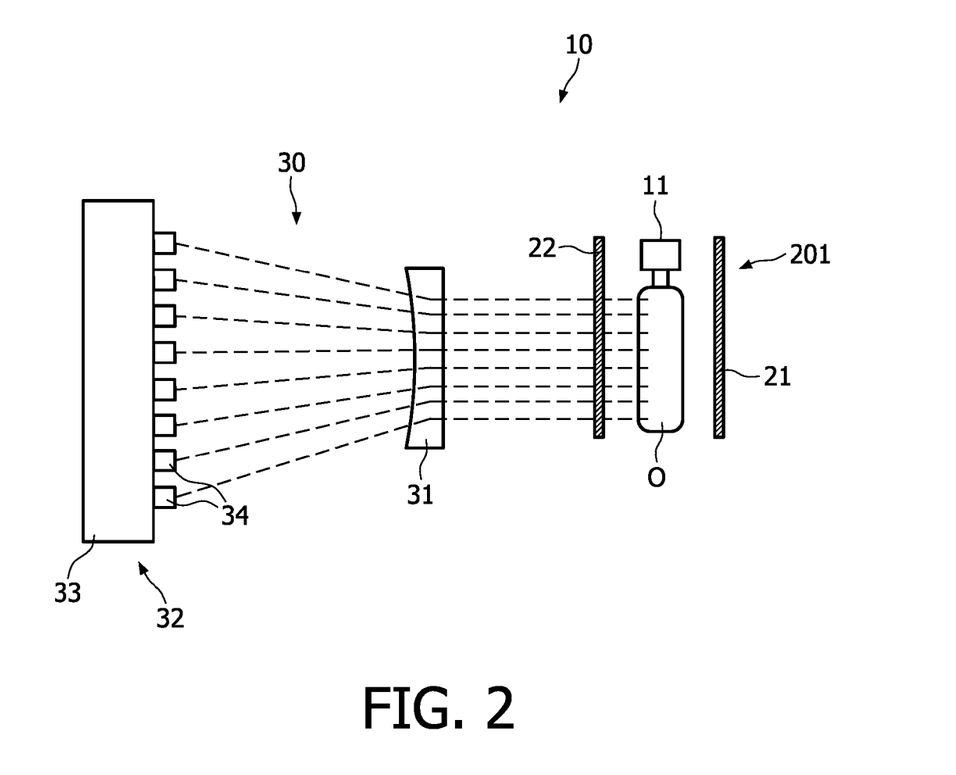
FIG. 2 shows a schematic cross-section of the embodiment of FIG. 1.

FIGS. 1 and 2 show a very simple embodiment, whereby FIG. 1 shows a top view from above onto a mirror arrangement 201 with two consecutive stages 210a, 201b. A beam of light L originating from a radiation device 30 is directed between these stages 201a, 201b into the mirror arrangement 201. Equally, the light can enter at the start of the first stage 201a in the same manner, but this is not shown here. Evidently, the entire realisation can comprise further stages with more positions at which the light can enter.

The mirror arrangement 201 features two mirror surfaces 21, 22 at each stage 201a, 201b. Here, the mirror surfaces 21, 22 are planar and approach each other at an angle in the manner of a funnel. The pre-forms O travel between these mirror surfaces 21, 22 along the production line P in a direction of transport OT. FIG. 2 shows a cross-section through the arrangement. The transport system 11, shown here simply as a block, can be a conveyer belt 11 with hooks from which the pre-forms O are hung and are moved through the space between the mirror surfaces 21, 22 that are flat in a direction perpendicular to the plane of FIG. 1. These mirror surfaces 21, 22 can be made of any suitable material that has a highly reflective on its inner surface in order to optimally reflect the light.

In this example, the light originates from a radiation device 30 with a radiation source 32 that comprises a number of VECSEL arrays 34 mounted together on a heat sink 33. The VECSEL arrays 34 are arranged so that the beams of laser light L meet in a horizontal plane (the drawing plane of FIG. 1) at a common focus coinciding with a point of entry PE of the light into the mirror arrangement 201. Here, this point of entry PE is located within an aperture slit 29 of the mirror arrangement 201.

Placing the focus of the whole assembly at the point of entry PE into the mirror arrangement 201 rather than at the PET pre-form O location has two advantages. Firstly, the opening slit 29 in the mirror arrangement 201 can be made as small as possible, in order to minimize any light leakage through this opening slit 29. Owing to the many reflections in the mirror arrangement 201, a low leakage level is important so that a high efficiency can be achieved. Secondly, the power distribution at the location of the PET pre-form O is more uniform. Furthermore, the pre-forms O may be rotated by an appropriately constructed transport system around their axis of symmetry (perpendicular to the drawing plane of FIG. 1), thus homogenizing the heat input into the pre-forms O even more.

As can be seen from FIG. 2, the individual VECSEL arrays 32 are also directed in a vertical plane at a focus. However, the beams of light are then made parallel by a lens 31 of the radiation device 30 to create a strip of light corresponding to the length of the aperture slit 29, where this length preferably corresponds exactly the height of the pre-forms O.

This has the advantage that the individual laser arrays 34 can be separated by larger distances, while having the beams parallel in the region between the mirror surfaces 21, 22. Along with the fact that the mirror surfaces 21, 22 are flat in the direction perpendicular to the plane of FIG. 1, another advantage is achieved in that the height of the laser beams with respect to the pre-form O is preserved, and it is possible to heat different parts of the pre-form O with different power levels. Therefore, the laser arrays 32 are grouped electrically and controlled with respect to the height, allowing individual settings of the laser power for different height zones. Instead of the lens 31, a more sophisticated optical system may be used with improved homogenisation, e.g. an optical integrator.

In another possible embodiment, which is not shown in the diagrams, the mirror surfaces are curved laterally with respect to the direction of transport of the objects. This embodiment can be visualised with the aid of FIG. 2, only that the mirror surfaces would be curved in the image plane instead of being flat. The amount of curvature can be very small, but sufficient to compensate for a slight divergence of the ray of light over its path between the mirror surfaces. This can be used to advantage in an application with different heating zones within the mirror arrangement, where the lasers are configured to generate beams of light with different intensity profiles. Here, the mirror surfaces may comprise two or more different height zones that act to marginally focus the light so that beams of light at different height zones do not significantly coalesce.

The system 1 may comprise a detection unit with feedback to the systems control to switch the laser power off when there are no pre-forms O being transported along the production line P.

The use of VCSELs or VECSELs as a light source is preferred for the described thermal application. Since the maximum power of these devices is much lower than that of high power laser diode bars, about 100 times as many single lasers are required. Even so, this is still much more economic than the standard approach using high power bars.

As mentioned above, VCSELs are surface emitting laser diodes, produced in wafers. The emitted beam is perpendicular to the wafer and is about 100 µm in diameter per emitter, a single emitter being, for example, 250 µm×250 µm in size. This means that tens of thousands of VCSELs are produced on a single wafer, and the resulting cost per emitter is very low. Furthermore, a typical 0.5 W IR output VCSEL dissipates about 1.5 W heat, which is rather standard in the LED world. This means that LED packaging and cooling methods can be used, and these are available at much lower cost than a high power laser diode bar approach.

Figure 3:
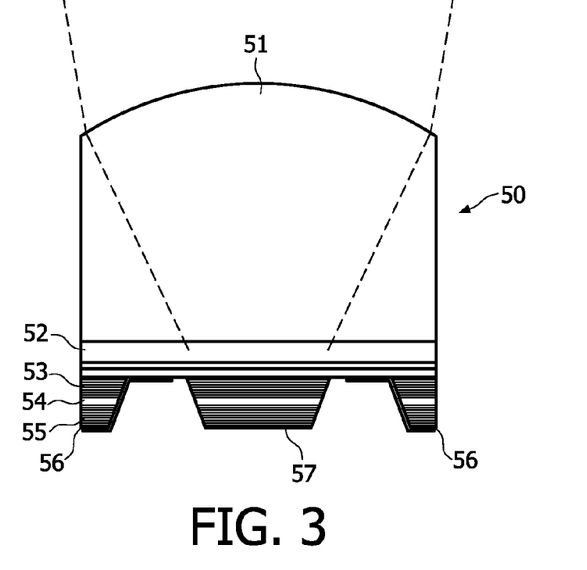
FIG. 3 shows a schematic cross-section of a VCSEL for use in an embodiment according to the invention.

FIG. 3 shows a structure of a VCSEL 51, with an additional focussing lens 51 that is not part of the VCSEL itself.

The substrate 52 is covered with intermediate layers, and a n-DBR structure 53, a gain region 54 positioned in the anti-node of the standing wave, and a p-DBR structure 55 are grown on top of these. After etching, part of the structure is metallised to allow an n-contact 56 and the p-contact 57. The VCSEL structure in the drawing has the additional advantage that electrical and thermal contacting is done from the bottom side only. This allows for a simple mounting as described above.

In order to have satisfactorily collimated beams, a micro-lens 51 in front of the VCSELs 50 may be used, as can be seen in FIG. 3. A typical beam divergence out of a VCSEL element is 10° half-cone, allowing for a F2.8 lens for collimation. A micro-lens in a distance of e.g. 400 μm from the VCSEL structure can collimate this into a 4° beam. Preferably, the micro-lens is of the plano-convex type, with the flat side positioned against the VCSEL structure for a simple mounting.

To reduce costs even further, small arrays of VCSELs 50 can be used instead of single emitters. Such arrays can be produced directly out of a wafer. For example, the mounting of a 4×4 array (i.e., a 1 mm×1 mm array with the numbers given above) on a structured heat sink is again possible. The structuring of the heat sink has to take into account the proper contacting of the individual VCSELs 50. An array of micro-lenses in front of the VCSEL array may be used in order to obtain collimated beams. The micro-lens array is preferably of the plano-convex type with the flat side positioned against the VCSEL structure for a very simple mounting. The micro-lens array can be manufactured as a single piece.

Figure 4:
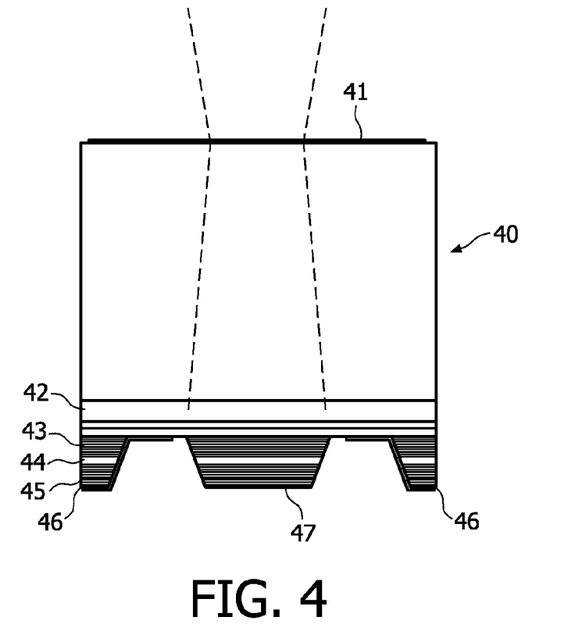
FIG. 4 shows a schematic cross-section of a VECSEL for use in an embodiment according to the invention.

VECSEL arrays (with the E for the extended cavity) are used in the particularly preferred embodiment of the examples shown in the figures. The structure of a VECSEL 40 is shown in FIG. 4. As in the case of the VCSEL 50, a substrate 42 is covered with intermediate layers and, on top of these, a n-DBR structure 43, a gain region 44 positioned in the anti-node of the standing wave and a p-DBR structure 45 are grown. Again, part of the structure is metallised after etching to give an n-contact 46 and a p-contact 47. Here, the cavity of the laser is extended by using a simple planar out-coupling mirror 41, which can be coated on a glass block 48 directly positioned on top of the substrate 42. A single coated glass block can be used for an entire VECSEL array.

The collimation of the beam of such a VECSEL 40 is better (e.g. 1° half-cone angle) than that of a VCSEL 50. The improved collimation is advantageous in this application, since it allows a better focusing of light L and it increases the working distance, i.e. the separation between the light source 32 and the production line P. The good collimation of the laser beams allows to 'spread' the laser arrays 32 over a larger area, while the radiation is focused on a small area for optimum heating. Therefore, the cooling of the arrangement can be further simplified. This is possible along the line of bottle movement as well as in the direction perpendicular to this.

In the embodiment shown in FIGS. 1 and 2, with a VECSEL beam divergence of 1° and a distance of 30 cm from the laser array 34 to pre-form O, a focus size of less than 1 cm is possible in the point of entry PE. This gives an indication of the accuracy which can be achieved that is sufficient for most applications.

As can be seen from FIG. 1, the main direction R of the bundle of the laser light L is directed such that each ray of light impinges on the mirror surface 21 opposite the aperture 29 at a predefined angle within the mirror arrangement 201 and is reflected back and forth in a zigzag manner between the mirror surfaces 21, 22 in the direction of transport OT, and therefore an overall direction of travel of the light LT travels in the same direction as the pre-forms O. Evidently, such an arrangement can also function against the transport direction OT. As a result, each beam of light impinges on multiple objects, and that the light intensity of each light ray is optimally exploited, since the absorption of the laser light is very low in a single journey through a PET pre-form O.

The particular arrangement of the mirror surfaces 21, 22 ensures that the light rays in the transport direction OT become more and more dense with increasing reflections, because the vector component of the ray of light in the transport direction OT becomes smaller as the number of reflections increases. In other words, the distance between the reflections along the axes of the production line becomes shorter and therefore the density of the rays becomes higher. The latter is especially advantageous, since this can compensate for the attenuation of the beams owing to multiple reflections and multiple passes through the material.

By expedient construction and choice of angle of the mirror surfaces 21, 22, it is even possible to cause the overall direction of travel of the light to be reversed, and to return against the transport direction. On this return journey, the light intensity of the light beam can also be further exploited.

This effect is described in the following, and with the aid of FIGS. 5 and 6. For the sake of clarity, only a single beam of light L is shown reflected back and forth between the mirror surfaces 21, 22. The beam of light L is indicated by a line. In the diagrams, for the sake of simplicity, the lower mirror surface 22 is regarded as a reference plane with respect to which the angles are computed. The computations could equally well be carried out with reference to a reference plane along the production line P. In that case, the two mirror surfaces 21, 22 are at an angle to the plane of reference, which would only make the computations more complex.

Figure 5:
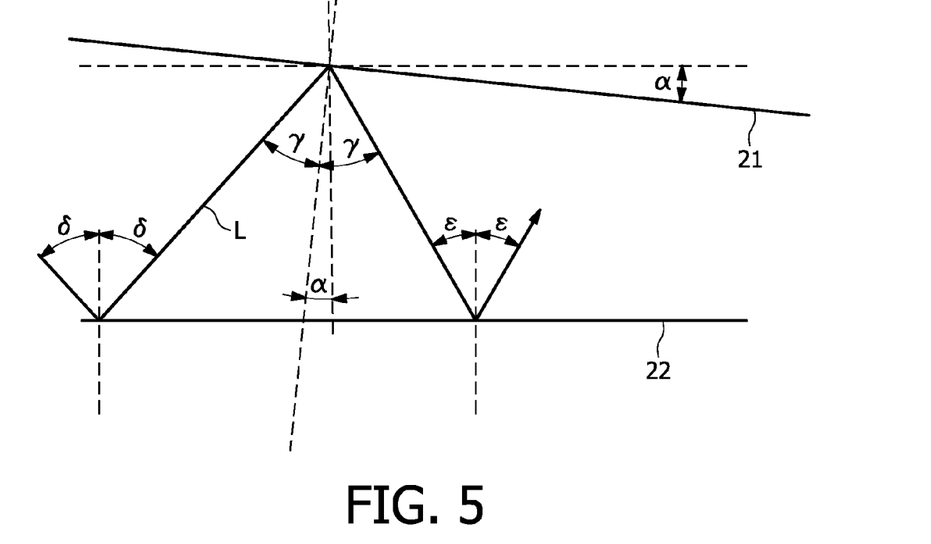
FIG. 5 shows a schematic cross-section of the mirror arrangement of FIG. 1 to demonstrate the reflection of a ray of light between the mirror surfaces.

For the angles shown in FIG. 5, $$\delta = \gamma + \alpha \tag{1a}$$

applies, and $$\epsilon = \gamma - \alpha \tag{1b}$$

where α is the angle between the two mirror surfaces, δ is the angle of entry of the beam of light, and γ and ε are the angles of reflection for the subsequent two reflections. It follows that $$\epsilon = \gamma - \alpha \tag{2}$$

The angle of incidence of the beam of light to the corresponding mirror surface 21, 22 (and therefore also the transverse angle of intersection of the ray of light with the production line P) decreases with every successive reflection. The overall direction of travel of the beam relative to the direction of transport of the objects is therefore reversed after the number of reflections given by $$\frac{\delta}{2 \cdot \alpha} \tag{3}$$

Figure 6:
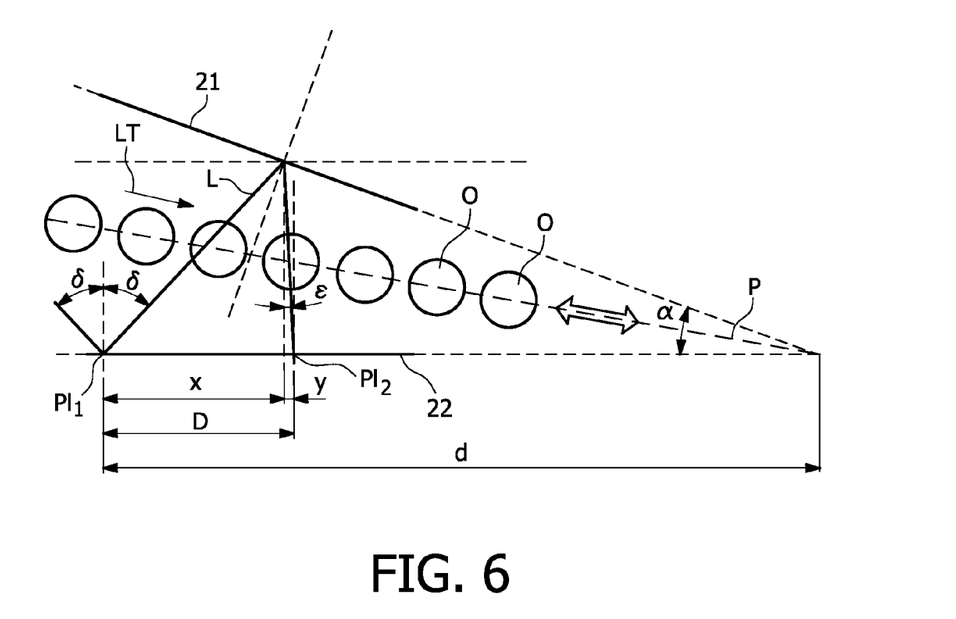
FIG. 6 shows a further schematic cross-section of the mirror arrangement of FIG. 1 to demonstrate the reflection of a ray of light between the mirror surfaces.

To calculate this point of reversal, the distance D between two points of incidence $PI_1$, $PI_2$ on a mirror surface must be determined, for which reference is made to FIG. 6. The transport direction of the pre-forms O along the production line P, as well as the overall direction of travel of light LT, are shown schematically again in FIG. 6. The following dependencies apply to the angles and distances shown in the diagram:

$$\tan(\delta) = \frac{x}{h} \to h = \frac{x}{\tan(\delta)} \quad (4)$$

and $$\sin(\alpha) = \frac{h}{d-x} \to h = \sin(\alpha) \cdot (d-x) \quad (5)$$

It follows that $$x = \sin(\alpha) \cdot \tan(\delta) \cdot \frac{d}{1 + \sin(\alpha) \cdot \tan(\delta)} \quad (6)$$

With $$\tan(\varepsilon) = \frac{y}{h} \quad (7)$$

it follows that $$y = h \cdot \tan(\varepsilon) = x \cdot \frac{\tan(\varepsilon)}{\tan(\delta)} = x \cdot \frac{\tan(\delta - 2 \cdot \alpha)}{\tan(\delta)} \quad (8)$$

so that the distance D to be determined is given by $$D = x + y = \sin(\alpha) \cdot d \cdot \frac{\sin(\delta) \cdot \cos(\delta - 2 \cdot \alpha) + \cos(\delta) \cdot \sin(\delta - 2 \cdot \alpha)}{(\cos(\delta) + \sin(\alpha) \cdot \sin(\delta)) \cdot \cos(\delta - 2\alpha)} \quad (9)$$

Given a total distance d of approximately 2 m between a first point of incidence $PI_1$ and a (virtual) point of intersection at which the two mirror surfaces 21, 22 would meet under a tilt angle of α=1° of one mirror surface 21 with regard to the other mirror surface, and given also a first angle of entry of the beam of light of 45°, it follows, using equation (9) in an iterative calculation, that the ray of light will reverse its overall direction after approximately twenty-two reflections. A virtual focus can be imagined at a distance of approximately 1.40 m from the first point of incidence $PI_1$.

Figure 7:
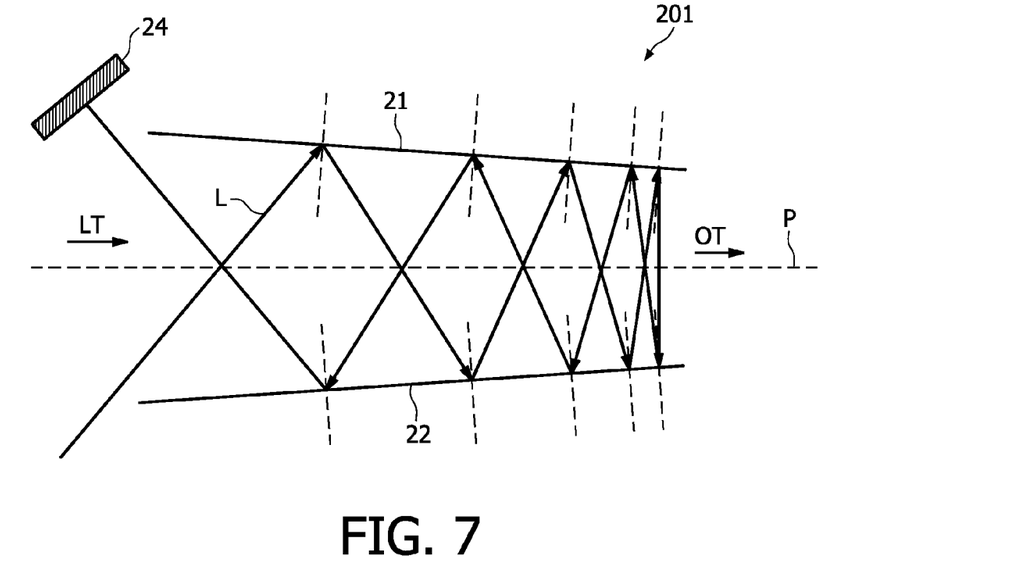
FIG. 7 shows a schematic top view of a mirror arrangement for a second embodiment according to the invention.

FIG. 7 schematically shows, once again, the path of a ray of light L in the transport direction OT along the production line P between the two mirror surfaces 21, 22 of the mirror arrangement 201. Towards a point of reversal, the density of the light beams increases and the ray of light will at some point reverse back in the direction in which it came, until it once again reaches the upper end of the mirror arrangement 201 and can be absorbed by a light sink or absorption element 24. Alternatively, a reflecting element could be used here to reflect the ray of light once again so that it can be further exploited. For example, the transition surface between two consecutive stages 201a, 201b shown in FIG. 1 and connecting the mirror surfaces 201a, 201b, could be coated on its inner surface with a highly reflective material so that it can fulfil this function.

Figure 8:
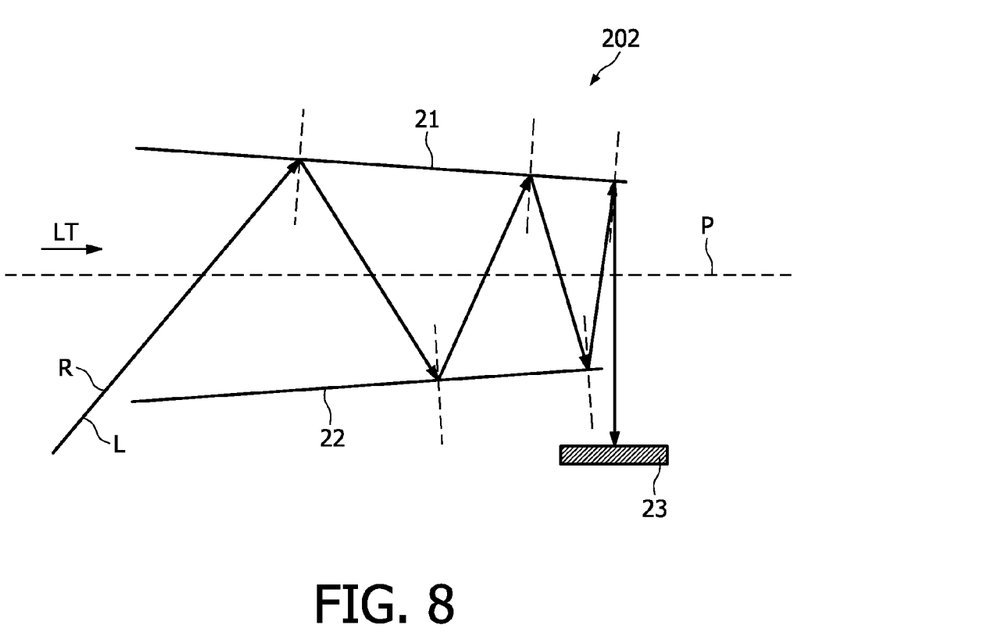
FIG. 8 shows a schematic top view of a mirror arrangement for a third embodiment according to the invention.

FIG. 8 shows an alternative variation of a mirror arrangement 202 for which the ray of light is out-coupled at the downstream ends and absorbed by an absorption element 23. This could be useful, for example, if the beam of laser light has been weakened significantly after being absorbed by multiple passes through the objects being heated.

Figure 9:
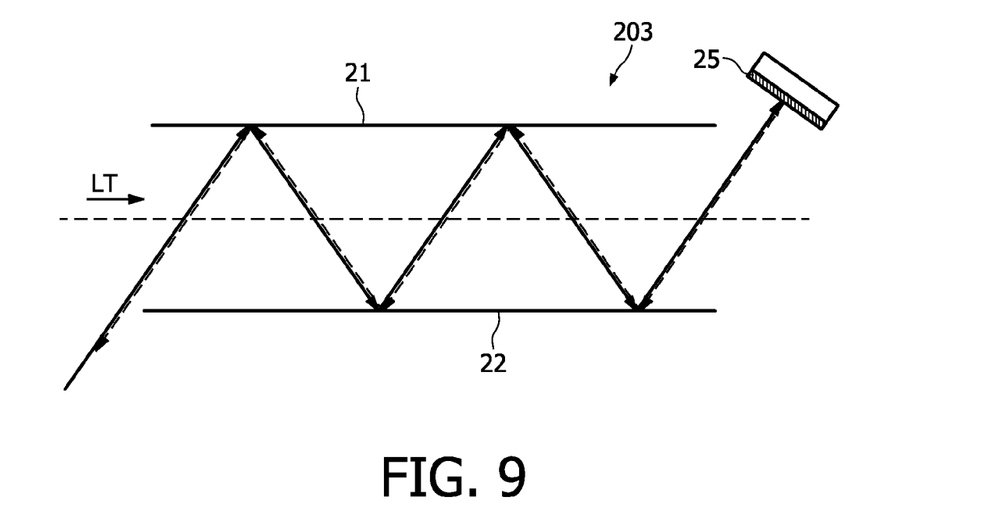
FIG. 9 shows a schematic top view of a mirror arrangement for a fourth embodiment according to the invention.

FIG. 9 schematically shows a variation of a mirror arrangement 203, for which the mirror surfaces 21, 22 are arranged parallel to each other. In this example, an external mirror element 25 in the form of a planar mirror is positioned at the end of the mirror arrangement 203 downstream of the direction of transport OT, and this planar mirror element 25 reflects the light back along the same path into the mirror arrangement 203. Alternatively, the reflection might be at a slight angle, in order to provide better coverage of the central region along the production line.

Figure 10:
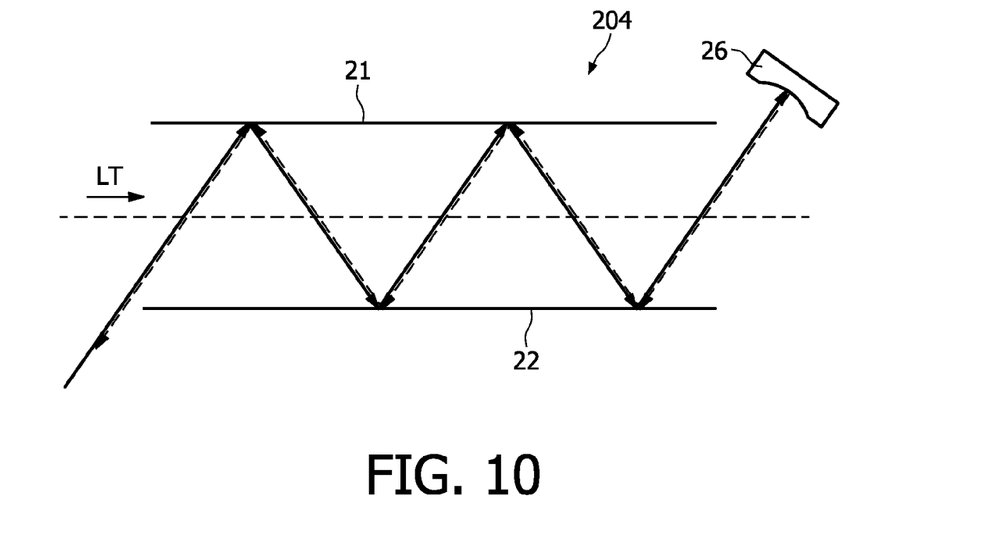
FIG. 10 shows a schematic top view of a mirror arrangement for a fifth embodiment according to the invention.

A similar variation of such a mirror arrangement 204 is shown in FIG. 10. Unlike in the mirror arrangement 203 of FIG. 9, the external mirror element 26 is curved in this case, in order to compensate for a practically unavoidable divergence of the beam of laser light after undergoing multiple reflections in the mirror arrangement 204.

Figure 11:
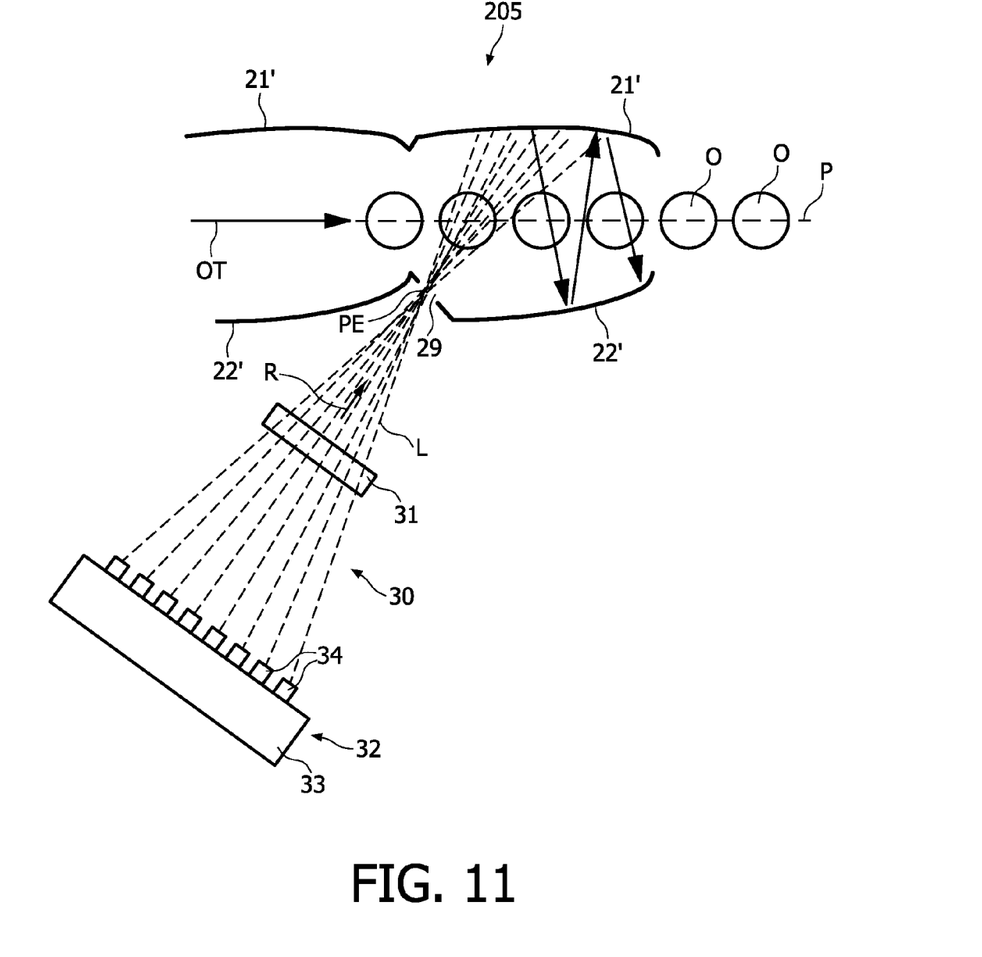
FIG. 11 shows a schematic top view in accordance with a sixth embodiment of the present invention.
Figure 12:
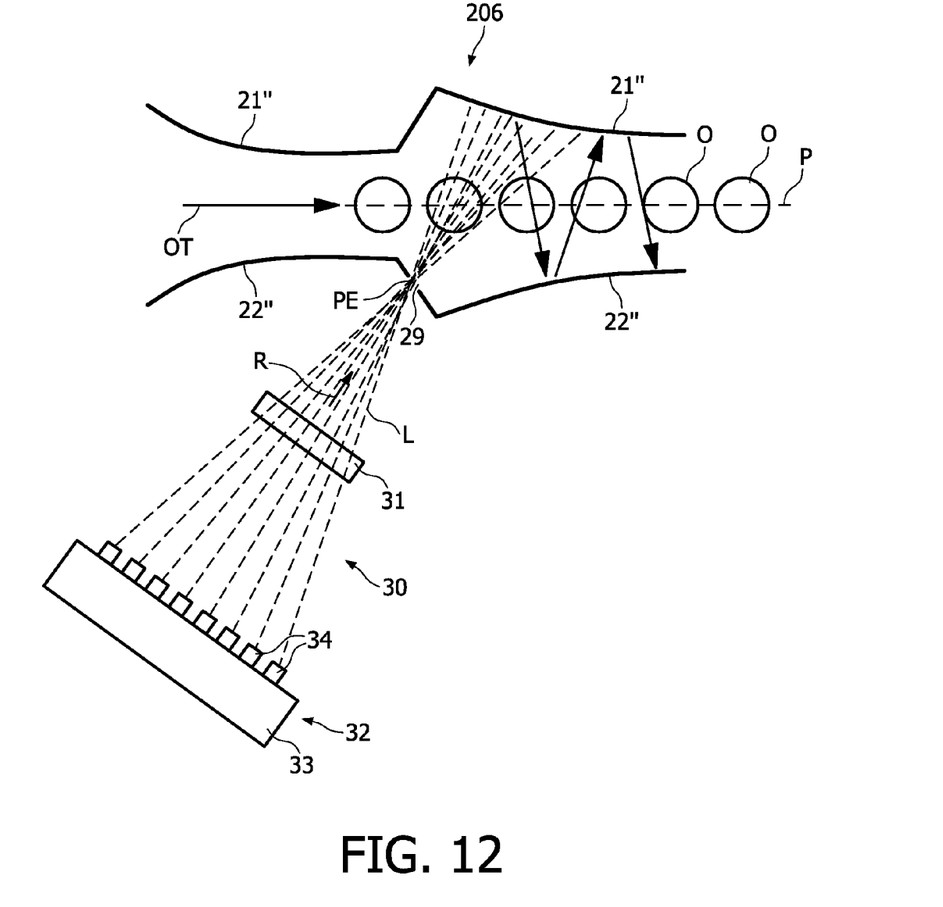
FIG. 12 shows a schematic top view in accordance with a seventh embodiment of the present invention.

In lieu of planar mirror surfaces 21, 22, curved mirror surfaces 21', 22', 21", 22" could be used. This is shown schematically in FIGS. 11 and 12. FIG. 11 shows an arrangement with mirror surfaces 21', 22' that are curved inwards in a concave manner at their downstream ends, in order to provide a certain intensity distribution. FIG. 12 shows another variation of a mirror arrangement 205 in which the mirror surfaces 21", 22" instead curve outwards at the upstream ends. The arrangement that is most advantageous will depend on the application and the correspondingly preferred intensity profile along the production line P.

Although the present invention has been disclosed in the form of preferred embodiments and variations thereon, it will be understood that numerous additional modifications and variations could be made thereto without departing from the scope of the invention. For example, the light of the individual lasers or laser arrays may be coupled into optical fibres, which are then used as a source for the heating application. This arrangement allows the mounting of the lasers in a remote situation on a large area, which simplifies heat spreading and cooling with conventional techniques.

Although referring mainly to the application in bottle blowing machines many other applications can profit from the inventions described here, like e.g. drying, hardening, rapid thermal processing. For the sake of clarity, it is also to be understood that the use of "a" or "an" throughout this application does not exclude a plurality, and "comprising" does not exclude other steps or elements.

The invention claimed is:

1. A system for heating objects (O) during a thermal treatment process in a production line (P) comprising:
    a transport system for transporting the objects (O) in a transport direction (OT) along the production line (P),
    a mirror arrangement comprising a first mirror surface and a second mirror surface arranged at opposite sides along at least a section of the production line (P), so that the objects (O) may be transported between the mirror surfaces along the production line (P),
    a radiation device comprising a number of lasers for generating light (L), wherein the radiation device and the mirror arrangement are constructed such that the main direction (R) of light (L) that enters the mirror arrangement is directed towards the first mirror surface at an angle to the production line (P),
    wherein the radiation device and the mirror arrangement are constructed such that the light (L) subsequently undergoes multiple reflections between the mirror surfaces so that a series of multiple reflections of the light (L) travels in the transport direction (OT) along at least a section of the mirror surface and also travels against the transport direction (OT) along at least a section of the mirror surface; thereby heating the objects (O) being transported between the mirror surfaces.

2. A system according to claim 1, wherein the objects (O) being transported are at least partially transparent to the generated light (L), and the light (L) is partially absorbed by a plurality of the objects (O) between the mirror surfaces while the objects (O) are transported through the mirror arrangement.

3. A system according to claim 1, wherein the mirror arrangement is arranged such that the multiple reflections of the light result in a predefined intensity profile of the light (L) in a direction (LT) of travel of the light downstream from a point of entry (PE) of the light (L) into the mirror arrangement.

4. A system according to claim 1, wherein the mirror arrangement is arranged such that the distances (D) between points of incidence ($PI_1$, $PI_2$) of a ray of light (L) on an individual mirror surface of the mirror arrangement decrease in a direction of travel (LT) of the light downstream from a point of entry (PE) of the light (L) into the mirror arrangement.

5. A system according to claim 1, wherein the mirror arrangement is arranged such that the first mirror surface and the second mirror surface approach one another over at least a section of the mirror arrangement along a direction of travel (LT) of the light downstream from a point of entry (PE) of the light (L) into the mirror arrangement.

6. A system according to claim 5, wherein the first mirror surface and the second mirror surface are planar along the direction of transport (OT) and are positioned at an angle to one another.

7. A system according to claim 5, wherein at least one of the mirror surfaces is curved so that at least a section of the mirror surface downstream from a point of entry (PE) of the light is curved inwards towards the objects (O) traveling on the production line (P).

8. A system according to claim 1, wherein the mirror arrangement is constructed such that the light (L) entering the mirror arrangement first travels in a first direction of travel (LT) of the light downstream from a point of entry (PE) of the light, and the direction of travel (LT) of the light is reversed after a certain distance in the mirror arrangement downstream from the point of entry (PE) of the light.

9. A system according to claim 8, wherein the mirror arrangement comprises a mirror surface region that is arranged to reflect the light (L) essentially in the opposite direction.

10. A system according to claim 1, wherein the first mirror surface and/or the second mirror surface are curved laterally with respect to the direction of transport (OT).

11. A system according to claim 1, wherein the mirror arrangement comprises a plurality of stages along the production line, wherein each stage comprises a first mirror surface and an opposite second mirror surface along a section of the production line (P); and,
wherein for each of a plurality of the stages, a light entry opening of the mirror arrangement enables the light (L) to enter.

12. A system according to claim 1, wherein the light (L) of at least a group of the lasers of the radiation device is focused to direct the light (L) into the mirror arrangement such that the light is focused in or near a light entry opening of the mirror arrangement.

13. A system according to claim 1, wherein the radiation device comprises a plurality of Vertical-Cavity Surface-Emitting Lasers.

14. A system according to claim 12, wherein the light entry opening has a length; wherein the radiation device comprises a lens arranged such that beams of light from the lasers are made parallel and formed into a strip of light approximately of the same length as the length of the light entry opening.

15. A system according to claim 14, wherein each of the objects rests upon a top surface of the production line and each has approximately the same height above the top surface; wherein the length of the light entry opening is approximately equal to the height.

16. A method for heating objects (O) during a thermal treatment process in a production line (P)
wherein the objects (O) are transported in a transport direction (OT) along the production line (P) between a first mirror surface and a second mirror surface of a mirror arrangement, which first mirror surface and second mirror surface are arranged at opposite sides along at least a section of the production line,
wherein light is generated by a number of lasers of a radiation device,
wherein the generated light (L) is directed into the mirror arrangement such that the main direction (R) of light (L) that enters the mirror arrangement is directed towards the first mirror surface at an angle to the production line (P), and the mirror arrangement is constructed such that the light (L) subsequently undergoes multiple reflections between the mirror surfaces so that a series of multiple reflections of the light (L) travels in the transport direction (OT) along at least a section of the mirror surface or travels against the transport direction (OT) along at least a section of the mirror surface and heats the objects (O) being transported between the mirror surfaces.

\* \* \* \* \*